United States Patent [19]

Kitayama et al.

[11] Patent Number: 5,030,056
[45] Date of Patent: Jul. 9, 1991

[54] SUBSTRATE TRANSFER DEVICE

[75] Inventors: Hirofumi Kitayama, Aikawa; Mitsuo Kato, Sagamihara; Eiichiro Takanabe; Masaru Kobayashi, both of Shiroyama, all of Japan

[73] Assignee: Tokyo Electron Sagami Ltd., Kanagawa, Japan

[21] Appl. No.: 555,645

[22] Filed: Jul. 23, 1990

[30] Foreign Application Priority Data

Dec. 2, 1988 [JP] Japan ................. 63-305609

[51] Int. Cl.$^5$ ............................................. B65G 49/00
[52] U.S. Cl. ................... 414/749; 414/331; 414/416; 414/156; 414/222; 901/8
[58] Field of Search ............. 414/150, 152, 156, 198, 414/222, 331, 404, 416, 749, 751; 901/7, 8, 21; 294/87.1

[56] References Cited

U.S. PATENT DOCUMENTS

| 4,319,864 | 3/1982 | Kaufeldt ................. 901/21 X |
| 4,728,252 | 3/1988 | Lada et al. ............... 901/21 X |
| 4,744,715 | 5/1988 | Kawabata ................. 414/404 X |
| 4,775,281 | 10/1988 | Prentakis ................. 414/331 X |

FOREIGN PATENT DOCUMENTS 60-231337 11/1985 Japan .
61-54639 3/1986 Japan .

*Primary Examiner*—Robert J. Spar
*Assistant Examiner*—Donald W. Underwood
*Attorney, Agent, or Firm*—Oblon, Spivak, McClelland, Maier & Neustadt

[57] ABSTRACT

A substrate transfer device containing an arm support member for supporting plural substrate support arms at one ends thereof, said arms having substrate housing areas at the other ends thereof, a structure arranged on a base to freely move in the longitudinal direction of the substrate support arms while holding the arm support member, another arm support member for holding a substrate support arm at the other side of the first arm support member, a structure arranged on the base to freely move in the longitudinal direction of the one substrate support arm while holding the arm support member for one substrate, a structure for moving the base up and down, and a structure for moving the base in a direction perpendicular to the substrate support arms on a plane parallel to the plane in which the substrate support arms are included.

6 Claims, 5 Drawing Sheets

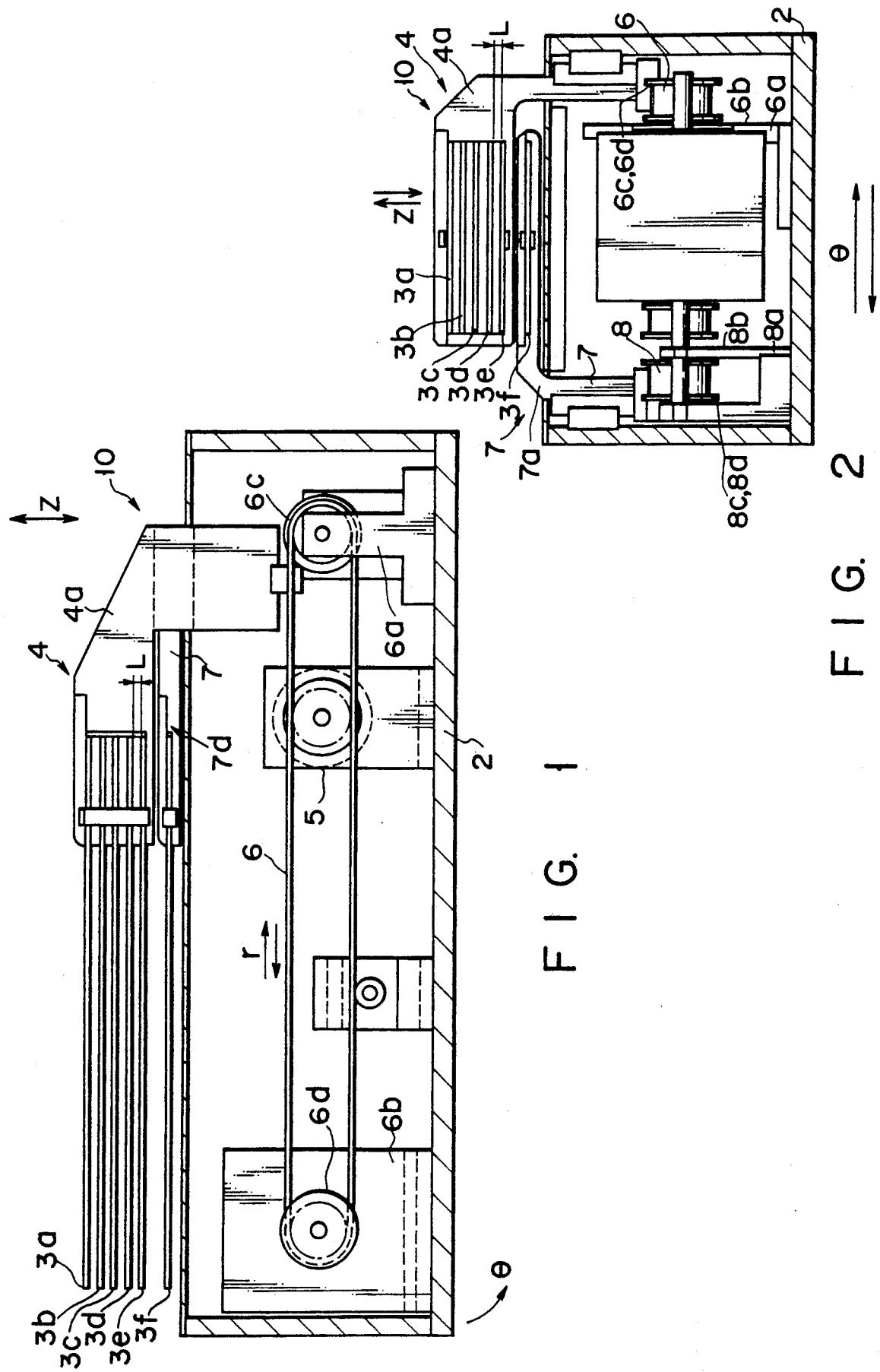

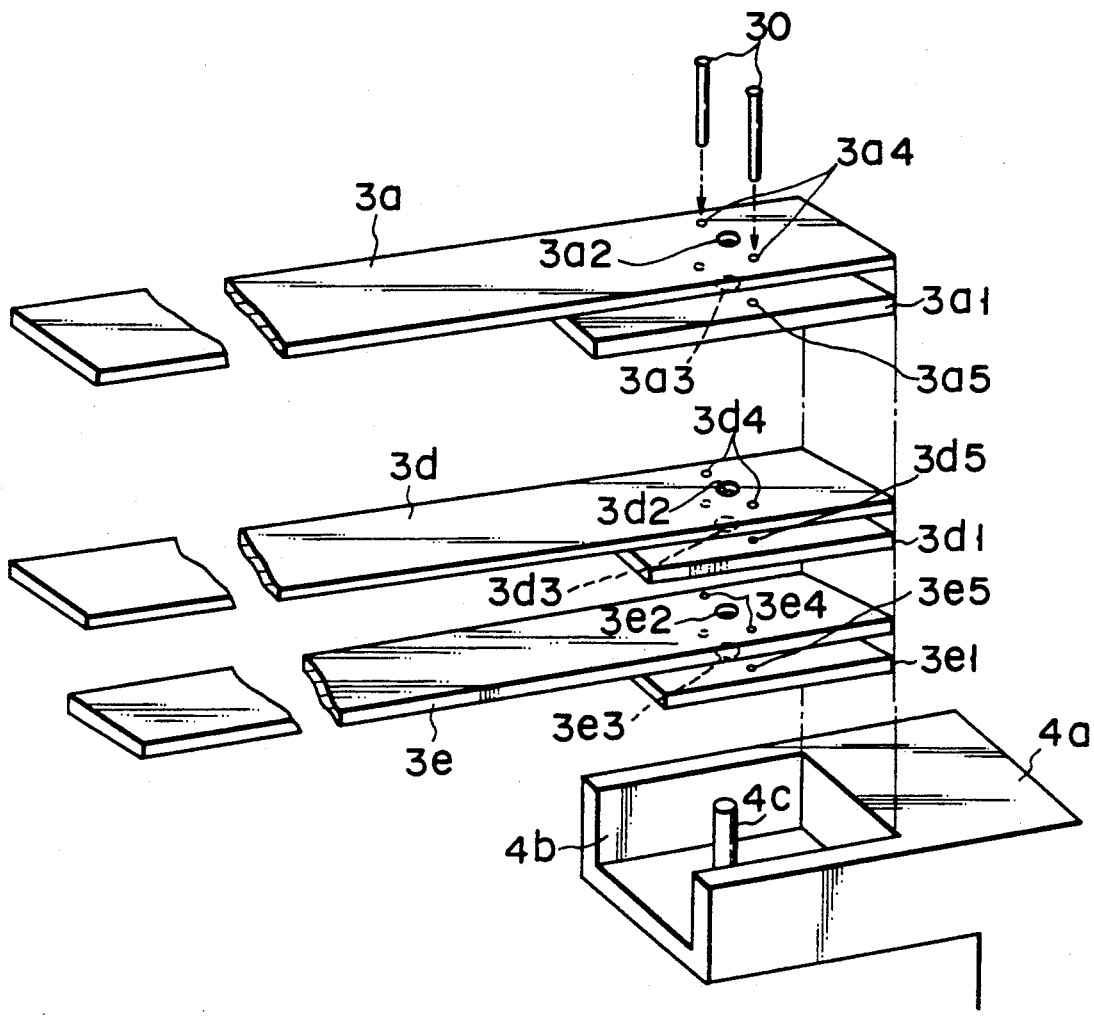
F I G. 5

SUBSTRATE TRANSFER DEVICE

BACKGROUND OF THE INVENTION

1. Field of the Invention

The present invention relates to a substrate transfer device.

2. Description of the Related Art

Substrates such as the semiconductor wafers are carried by holders such as the wafer cassette and wafer carrier in the course of manufacturing semiconductor devices. These holders for holding substrates to be carried are made by light and cheap resin and designed to house 25 sheets of semiconductor wafers, for example.

In a case where a plurality of the semiconductor wafers are batch-processed in a heat processing apparatus, for example, the above-mentioned resin-made holders cannot be used. A holder for holding substrates to be processed which is called wafer boat made of quartz excellent in chemical stability and heat proofness is therefore often used. This holder is designed to house over a hundred sheets of semiconductor wafers.

A substrate transfer device disclosed in Japanese Patent Disclosures Sho 60-231337 and 61-54639 is used to transfer the semiconductor wafers between the wafer boat and the wafer cassettes. The substrate transfer device supports the wafer boat substantially horizontal, grasps plural sheets of semiconductor wafers in the wafer cassettes and then transfer them to the wafer boat.

In a case where the semiconductor wafers are processed in the vertical heat processing apparatus, however, dummy wafers are arranged on the top and bottom of the semiconductor wafers to be processed and a test wafer is arranged every predetermined number of the semiconductor wafers to be processed. When plural sheets of the semiconductor wafers are grasped and transferred as a unit as described above in this case, the dummy wafers which are not to be processed are carried together into the vertical heat processing apparatus. In the case of another substrate transfer device intended to transfer the semiconductor wafers one by one, it takes a long time to transfer the wafers.

SUMMARY OF THE INVENTION

The object of the present invention is to provide a substrate transfer device capable of extremely smoothly achieving the transferring of one or plural substrates and shortening the time needed to achieve this transferring to a greater extent.

According to the present invention, there can be provided a substrate transfer device comprising an arm support member for supporting plural substrate support arms at one ends thereof, said arms having substrate housing areas at the other ends thereof; a means arranged on a base to freely move in the longitudinal direction of the substrate support arms while holding the arm support member; another arm support member for holding a substrate support arm at the other side of the first arm support member; a means arranged on the base to freely move in the longitudinal direction of the one substrate support arm while holding the arm support member for one substrate; a means for moving the base up and down; and a means for moving the base in a direction perpendicular to the substrate support arms on a plane parallel to the plane in which the substrate support arms are included.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a front view showing the main portion of an example of the transfer device according to the present invention;

FIG. 2 is a side view showing the transfer device;

FIG. 5 shows the substrate supporting arm disassembled;

DETAILED DESCRIPTION OF THE PREFERRED EMBODIMENT

Figure 3:
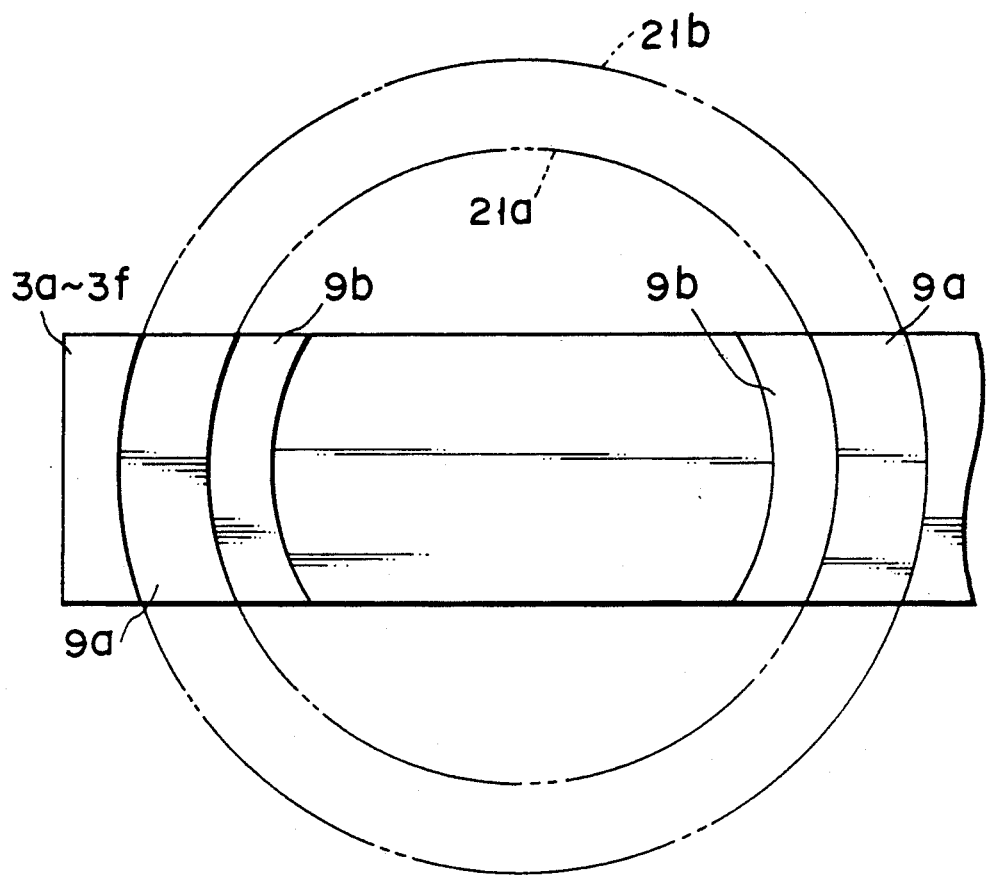
FIG. 3 is a plan showing an arm for supporting a substrate.

FIG. 1 is a front view showing the main portion of an example of the transfer device according to the present invention and FIG. 2 is a side view showing the transfer device. Reference numeral 2 represents a base for the transfer device 10. Pulley support members 6a and 6b are erected on both ends but at one side of the base 2. Pulleys 6c and 6d are freely rotatably attached to the pulley support members 6a and 6b. A driven belt 6 is stretched between the pulleys 6c and 6d. The driven belt 6 is reciprocated in the longitudinal direction (r) of the base 2 by a motor 5 which is arranged on the base 2 to contact the driven belt 6. The lower end of a reversed L-like arm support member 4a is attached to the driven belt 6. Five sheets, for example, of substrate support arms 3a–3e are held substantially horizontal with their one ends supported by the upper end of the arm support member 4a. Each of the substrate support arms 3a–3e is made of alumina.

Figure 4:
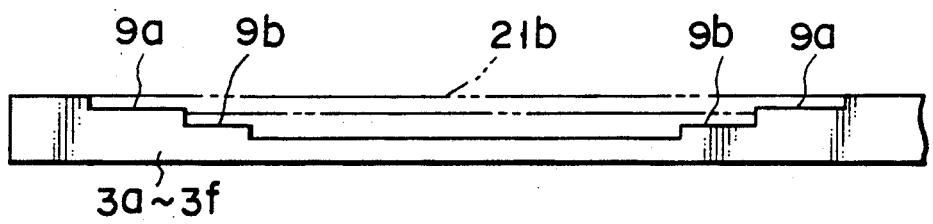
FIG. 4 is a front view showing the substrate supporting arm.

The interval (L) between the two adjacent substrate support arms is such that substrates can be freely set on and taken out of the substrate support arms 3a–3e. This interval (L) is determined depending upon the pitch of housing wafers from the wafer cassette or wafer boat which will be described later. Grooves 9a and 9b for housing wafers to be processed are formed on the other end of each of the substrate support arms 3a–3e, as shown in FIGS. 3 and 4. The grooves 9a and 9b are formed like steps to house two wafers 21a and 21b, different in diameter, or 6 and 5 inches wafers in this case. The grooves 9a and 9b are concentric to house the wafers 21a and 21b, different in diameter, without using any vacuum suction means and doing any mechanical and soft design change. In short, one wafer 21a or 21b is housed in every substrate support arm and five wafers 21a or 21b in total are supported by the substrate support arms 3a–3e. These substrate support arms substrate support system 4.

The attaching of the substrate support arms 3a–3e relative to the arm support member 4a is carried out as shown in FIG. 5. One ends of the substrate support arms 3a–3e are fitted into a recess 4b of the arm support member 4a with one of spacers 3a1–3e1 interposed between the two adjacent substrate support arms 3a–3e. While fitting them into the recess 4b, a pin 4c erected on the recess 4b is inserted through their through-holes 3a2–3e2 and those 3a3–3e3 of the spacers 3a1–3e1. Fixing pins 30 are then inserted into fixing holes 3a4–3e4 and 3a5–3e5 provided on both sides of the through-holes 3a2–3e2 and 3a3–3e3, respectively, of the substrate support arms 3a–3e and spacers 3a1–3e1 to position and fix the substrate support arms 3a–3e.

As shown in FIG. 2, pulley support members 8a, 8b, pulleys 8c, 8d and a driven belt 8 similar to those mentioned above are arranged on both ends but at the other side of the base 2. The driven belt 8 is reciprocated in the longitudinal direction (r) of the base 2 by a motor (not shown) arranged on the base 2.

The lower end of an arm support member 7 for one wafer or substrate is attached to the driven belt 8. The upper portion 7a of the arm support member 7 for one wafer is located or housed just under the arm support member 4a to freely come into and out of there. One end of a one substrate support arm 3f is attached to the upper end 7a of the arm support member 7. Grooves similar to those on each of the substrate support arms 3a–3e are formed on the other end of the substrate support arm 3f. The arm support member 7, its upper end 7a and the like form a single substrate support system.

The base 2 is connected to a drive system (not shown) and can be reciprocated up and down (as shown by arrows Z) and in the horizontal direction (as shown by arrows θ).

Figure 6:
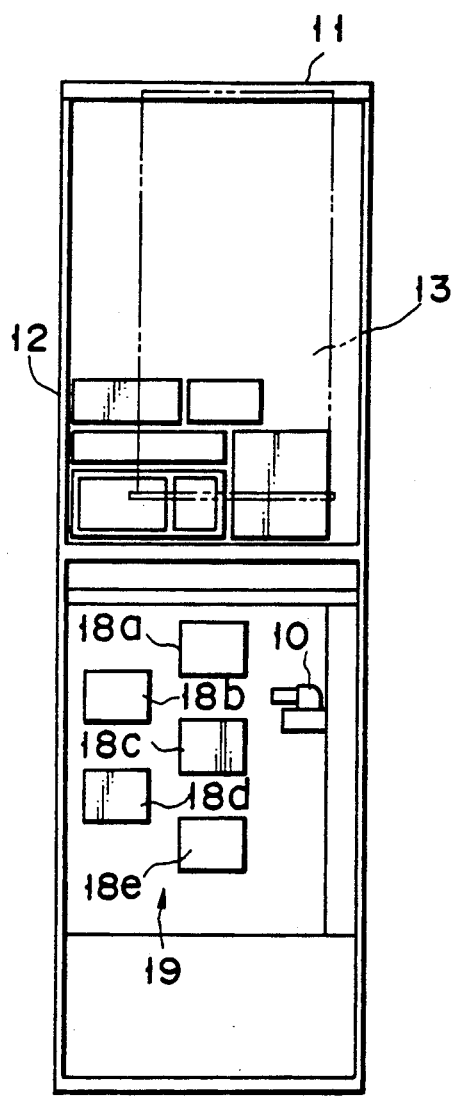
FIG. 6 is a front view showing a vertical heat processing apparatus into which the transfer device shown in FIG. 1 is incorporated.
Figure 7:
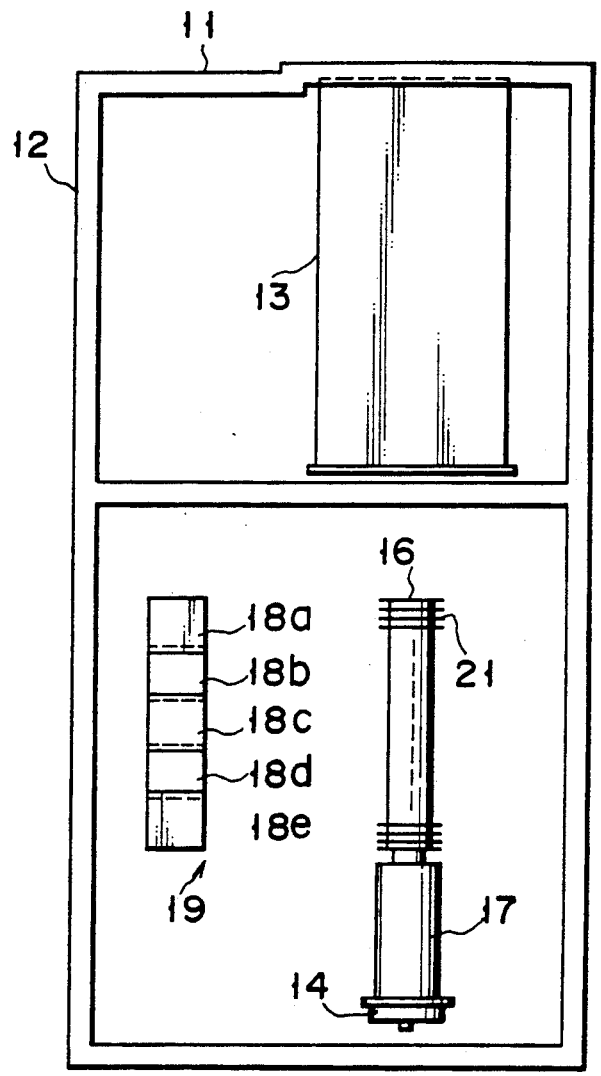
FIG. 7 is a side view showing the vertical heat processing apparatus.
Figure 8:
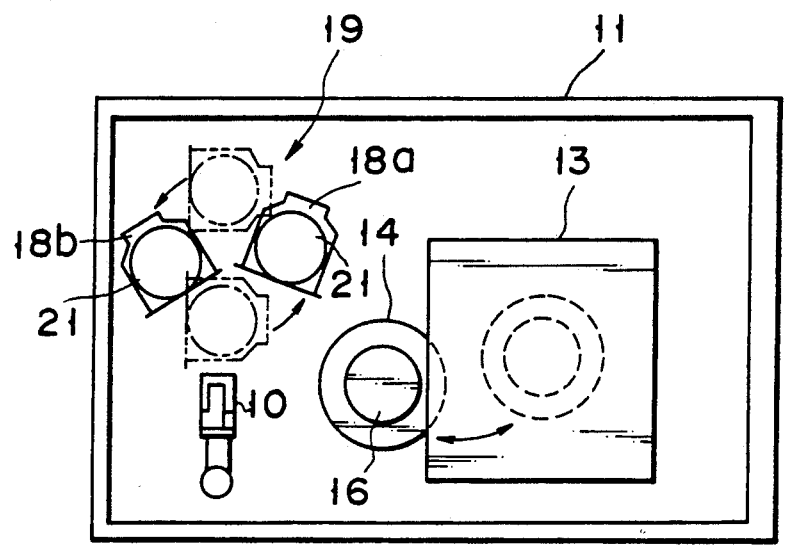
FIG. 8 is a plan showing the vertical heat processing apparatus.

The transfer device 10 having the above-described arrangement is incorporated into a case 11 of the vertical heat processing apparatus, as shown in FIGS. 6 and 7. A control panel 12 is arranged at the upper and front portion of the case 11. Vertically arranged behind the control panel 12 is a heat processing furnace 13 comprising a reaction tube made of quartz, for example, a soaking tube enclosing the reaction tube, a heater and insulating material.

Arranged under the heat processing furnace is a boat elevator 14 freely movable up and down. The boat elevator 14 loads and unloads a holder (or wafer boat made of quartz) 16 for substrates to be processed into and out of the heat processing furnace 13 from underside, while keeping the holder 16 mounted vertical on a heat insulating sleeve 17. The holder 16 can hold over a hundred sheets of semiconductor wafers 21, for example. The heat processing furnace 13 is intended to apply heat process to the semiconductor wafers 21 to form CVD film thereon.

A wafer cassette housing section 19 is arranged in the case 11 at the front and lower portion thereof. Five holders (or wafer cassettes) 18a–18e for holding substrates to be carried can be mounted on the wafer cassette housing section 19. Each of the holders 18a–18e for substrates to be carried can house 25 sheets of semiconductor wafers, for example.

The transfer device 10 is located beside the wafer cassette housing section 19 to transfer the semiconductor wafers 21 between the wafer cassettes 18a–18e and the wafer boat 16.

Figure 9:
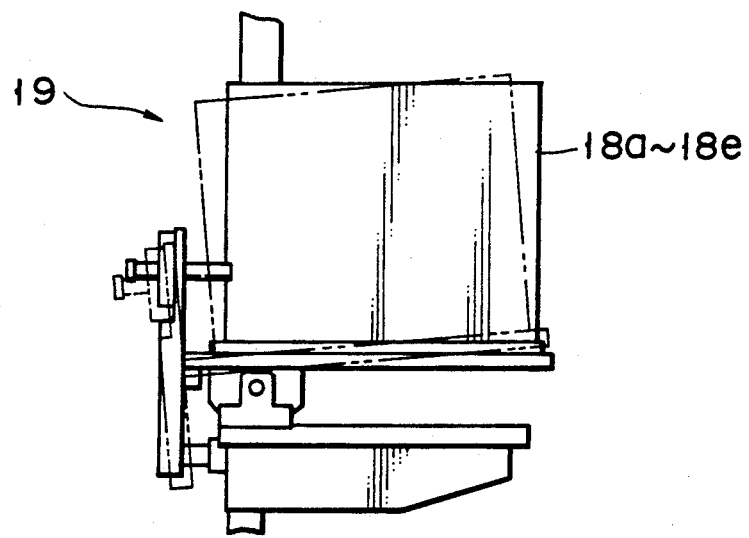
FIG. 9 is intended to explain the arrangement of a cassette housing section in the vertical heat processing apparatus.

The wafer cassette housing section 19 is freely rotatable, as shown in FIG. 9. The wafer cassette housing section 19 rotates to set one of the wafer cassettes 18a–18e against the transfer device 10 so that the transfer device 10 can carry out the transfer of the semiconductor wafers 21.

The wafer cassette housing section 19 houses the wafer cassettes 18a–18e tilted in such a way that their bottoms are directed downward but their open sides through which the semiconductor wafer is pulled out are directed upward. Namely, when the wafer cassette housing section 19 is to be rotated, the wafer cassettes 18a–18e are kept tilted. The wafer cassettes 18a–18e are made horizontal only when the transfer of the semiconductor wafers 21 is carried out by the transfer device 10. This prevents the semiconductor wafers 21 from coming out of the wafer cassettes 18a–18e and shifting from their original positions in the cassettes.

The heat process is carried out by the heat process furnace 13, as follows, to form CVD film on the semiconductor wafer 21, for example.

The wafer cassette housing section 19 is rotated to set predetermined one of the wafer cassettes 18a–18e against the transfer device 10. The wafer boat 16 is then moved toward the transfer device 10 by the boat elevator 14.

The base 2 of the transfer device 10 is moved under this state and the substrate support system 4 is moved to transfer five sheets of the semiconductor wafers 21 from the wafer cassettes 18a–18e to the wafer boat 16. The arm support member 7 for one wafer is similarly moved to transfer dummy or test wafers one by one from the wafer cassettes 18a–18e to the wafer boat 16. In short, five sheets of wafers are pulled out of the wafer cassettes in which wafers to be processed are contained, and transferred to the wafer boat by the substrate support system 4. The dummy wafers are pulled out of dummy wafer cassettes one by one by the arm support member 7 for one wafer and transferred to previously programmed positions on the wafer boat 16.

The transfer of the wafers 21 is carried out successively from up to down when the wafer boat 16 is erected vertical. Three sheets of dummy wafers, for example, are transferred from the wafer cassettes 18a–18e to the wafer boat 16 by three rotations of the arm support member 7 for one wafer, setting the wafers on the boat 16 successively from top to down. 50 sheets of wafers to be processed are then transferred from the wafer cassettes 18a–18e to the wafer boat 16 just under the three dummy wafers by ten rotations of the substrate support system 4. One sheet of test wafer is transferred to the wafer boat 16 by the arm support member 7 for one wafer and 50 sheets of wafers to be processed are then transferred by the substrate support system 4.

When this transfer of wafers is finished, the wafer boat 16 is carried under the heat processing furnace 13 and loaded into the furnace to carry out a predetermined heat process to form CVD film on the wafers.

When this heat process is finished, the wafer boat 16 is unloaded from the heat processing furnace 13 and the semiconductor wafers 21 are transferred from the wafer boat 16 to the wafer cassettes 18a–18e by the transfer device 10.

According to the transfer device 10 as described above, the base 2 is moved in the directions (θ) and (z) and the substrate support system 4 or arm support member 7 for one wafer is moved in the direction (r). Therefore, a unit of five or one sheet(s) of the semiconductor wafers 21 can be transferred between the wafer cassettes 18a–18e and the wafer boat 16. As the result, two or three sheets of dummy wafers can be set on the wafer boat 16 at the top or bottom thereof and one sheet of test wafer can be set between the two adjacent semiconductor wafers to be processed. Further, the time needed to transfer the wafers can be reduced to a greater extent because five sheets of the semiconductor wafers 21 to be processed are transferred once a time. In addition, the transferring of the wafers 21 can be made easier.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrate transfer device comprising:
   an arm support member for supporting plural substrate support arms at one ends thereof, said arms having substrate housing areas at the other ends thereof;
   a means for moving the substrate support arms arranged on a base to freely move in the longitudinal direction of the substrate support arms while holding the arm support member at one side of the base;
   another arm support member for holding one substrate support arm ;
   a means for moving the one substrate support arm arranged on the base to freely move in the longitudinal direction of the one substrate support arm while holding the arm support member for the one substrate support arm at the other side of the base, said arm support member and said another arm support member extending in opposite directions across the base;
   a means for moving the base up and down; and
   means for moving the base in a direction perpendicular to all the said substrate support arms on a plane parallel to the plane in which the substrate support arms are included.

2. The substrate transfer device according to claim 1, wherein each of the substrate support arms has plural concentric grooves on one end thereof which serve as the substrate housing area.

3. The substrate transfer device according to claim 1, wherein the substrate support arms are fitted into a recess of the arm support member at one end thereof with a spacer interposed between the adjacent ones and fixed there by plural pins.

4. The substrate transfer device according to claim 1, wherein the means for moving the substrate support arms includes a pair of pulley support members erected on both ends but at one side of the base, a driven belt stretched between pulleys attached to the pulley support members and to which the arm support member is connected, and a mean for driving the belt.

5. The substrate transfer device according to claim 1, wherein the means for moving the one substrate support arm includes a pair of pulley support members erected on both ends but at the other side of the base, a driven belt stretched between pulleys attached to the pulley support members and to which the arm support member for one substrate is connected, and a means for driving the belt.

6. The substrate transfer device according to claim 1, wherein the means for moving the base up and down and left and right serve to change the position of the base between a holder for holding substrates to be processed and another holder for holding substrates to be carried.

* * * * *

UNITED STATES PATENT AND TRADEMARK OFFICE
CERTIFICATE OF CORRECTION

PATENT NO. : 5,030,056

DATED : July 9, 1991

INVENTOR(S) : Hirofumi Kitayama et al.

It is certified that error appears in the above-identified patent and that said Letters Patent is hereby corrected as shown below:

On the title page:
　The Foreign Application Priority Data should be deleted.

Signed and Sealed this

Thirteenth Day of April, 1993

Attest:

STEPHEN G. KUNIN

*Attesting Officer*　　　　　Acting Commissioner of Patents and Trademarks